United States Patent
Fukushima et al.

(10) Patent No.: US 11,757,055 B2
(45) Date of Patent: Sep. 12, 2023

(54) ELECTROMAGNETIC WAVE DETECTOR, AND ELECTROMAGNETIC WAVE DETECTOR ARRAY

(71) Applicant: Mitsubishi Electric Corporation, Tokyo (JP)

(72) Inventors: Shoichiro Fukushima, Tokyo (JP); Masaaki Shimatani, Tokyo (JP); Shimpei Ogawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 449 days.

(21) Appl. No.: 16/980,437

(22) PCT Filed: Feb. 28, 2019

(86) PCT No.: PCT/JP2019/007781
§ 371 (c)(1),
(2) Date: Sep. 14, 2020

(87) PCT Pub. No.: WO2020/003613
PCT Pub. Date: Jan. 2, 2020

(65) Prior Publication Data
US 2021/0020797 A1 Jan. 21, 2021

(30) Foreign Application Priority Data
Jun. 26, 2018 (JP) ................. 2018-121156

(51) Int. Cl.
*H01L 31/032* (2006.01)
*G01J 1/02* (2006.01)
*H01L 31/0384* (2006.01)

(52) U.S. Cl.
CPC .......... *H01L 31/032* (2013.01); *G01J 1/0295* (2013.01); *H01L 31/0384* (2013.01)

(58) Field of Classification Search
CPC .............. H01L 31/032; H01L 31/0384; H01L 27/1446; H01L 31/028; H01L 31/036;
(Continued)

(56) References Cited

U.S. PATENT DOCUMENTS

| 2007/0108484 | A1 | 5/2007 | Nagamune et al. |
| 2011/0042650 | A1 | 2/2011 | Avouris et al. |

FOREIGN PATENT DOCUMENTS

| JP | 2003-130959 A | 5/2003 |
| JP | 2013-502735 A | 1/2013 |
| WO | 2005/008787 A1 | 1/2005 |

OTHER PUBLICATIONS

International Search Report and Written Opinion dated Apr. 23, 2019 for PCT/JP2019/007781 filed on Feb. 28, 2019, 9 pages including English Translation of the International Search Report.

*Primary Examiner* — Jarrett J Stark
(74) *Attorney, Agent, or Firm* — XSENSUS LLP

(57) ABSTRACT

An electromagnetic wave detector 100 comprises: a substrate 5 having a front surface and a back surface; an insulating layer 4 formed of a rare earth oxide, which is provided on the front surface of the substrate 5; a pair of electrodes 2 provided on the insulating layer 4 so as to be arranged to face each other across a gap; and a two-dimensional material layer 1 provided on the insulating layer 4 so as to be electrically connected to the pair of electrodes 2. The rare earth oxide contains a base material made of an oxide of a first rare earth element, and a second rare earth element different from the first rare earth element, which is activated in the base material.

17 Claims, 9 Drawing Sheets

(58) Field of Classification Search
CPC .. H01L 31/113; H01L 31/0272; G01J 1/0295; H10K 39/00
See application file for complete search history.

ELECTROMAGNETIC WAVE DETECTOR, AND ELECTROMAGNETIC WAVE DETECTOR ARRAY

CROSS-REFERENCE TO RELATED APPLICATIONS

The present application is based on PCT filing PCT/JP2019/007781, filed Feb. 28, 2019, which claims priority to JP 2018-121156, filed Jun. 26, 2018, entire contents of each are incorporated herein by reference.

TECHNICAL FIELD

The present invention relates to an electromagnetic wave detector and an electromagnetic wave detector array, and more particularly to: an electromagnetic wave detector that use a two-dimensional material in a light detection layer and a rare earth in an insulating layer; and an electromagnetic wave detector array.

BACKGROUND ART

Two-dimensional materials have been attracting attention as materials in electromagnetic wave detection layers to be used in next-generation electromagnetic wave detectors. For example, graphene has a band gap that is zero or extremely small, and hence the wavelength range of an electromagnetic wave that can be detected can be widened as compared with conventional electromagnetic wave detectors. For example, there has been proposed an electromagnetic wave detector in which a gate oxide film is provided on a substrate, a graphene channel layer is deposited on the gate oxide film, and a source and a drain are formed at both ends of the channel layer (e.g., see Patent Document 1).

PRIOR ART DOCUMENT

Patent Document

Patent Document 1: JP 2013-502735 A

SUMMARY OF THE INVENTION

Problem to be Solved by the Invention

However, when an electromagnetic wave detection layer of an electromagnetic wave detector is formed of graphene alone, the absorption rate of an electromagnetic wave is as very low as a few percent with graphene, so that there has been a problem that a detection sensitivity becomes low even though the wavelength range of an electromagnetic wave that can be detected is widened.

Then, the present invention is aimed at obtaining an electromagnetic wave detector that can detect an electromagnetic wave with high sensitivity.

Means for Solving the Problem

One aspect of the present invention provides an electromagnetic wave detector that includes: a substrate having a front surface and a back surface; an insulating layer formed of a rare earth oxide, which is provided on the front surface of the substrate; a pair of electrodes provided on the insulating layer so as to be arranged to face each other across a gap; and a two-dimensional material layer provided on the insulating layer so as to be electrically connected to the pair of electrodes. The rare earth oxide contains: a base material made of an oxide of a first rare earth element; and a second rare earth element different from the first rare earth element, which is activated in the base material.

Effects of the Invention

In the present invention, by activating a rare earth element in the rare earth oxide of the insulating layer, an internal electric field is generated in the insulating layer when an electromagnetic wave is incident, so that a voltage is applied to the two-dimensional material layer. In the two-dimensional material layer, the mobility of an electron is large and a large current change occurs even with a slight voltage change, so that an electromagnetic wave can be detected with good sensitivity.

Further, according to the present invention, a wavelength to be selected and a sensitivity can be adjusted by changing the rare earth element to be activated in the rare earth oxide of the insulating layer, whereby an electromagnetic wave can be detected with high sensitivity.

EMBODIMENTS OF THE INVENTION

In the embodiments of the present invention, an electromagnetic wave detector that detects visible light or infrared light will be described. However, the embodiments of the present invention can also be applied to the detection of an electromagnetic wave such as an X-ray, ultraviolet light, near-infrared light, a terahertz (THz) wave in a so-called radio wave region, or a microwave.

The electromagnetic wave detector will be described by using a structure having two electrodes of a source electrode and a drain electrode, and a structure further having a back electrode serving as a back gate, but the present invention can also be applied to electromagnetic wave detectors having other electrode structures such as a four-terminal electrode structure and a top-gate structure.

Additionally, regarding: a surface plasmon resonance phenomenon that is an interaction between a metal surface and light; a plasmon resonance phenomenon; a phenomenon called pseudo surface plasmon resonance in the sense of resonance on a metal surface other than a visible light range or a near-infrared light range; or a phenomenon called metamaterial or plasmonic metamaterial in the sense of operating a specific wavelength with a structure of a size less than or equal to the wavelength, these are not distinguished by name and treated as equivalent from the viewpoint of the effects caused by the phenomena. Here, these resonances are called surface plasmon resonance, plasmon resonance, or simply resonance.

Hereinafter, electromagnetic wave detectors according to the embodiments of the present invention will be described with reference to the drawings. In each embodiment, the same components are denoted by the same reference symbols and the description thereof will be omitted.

First Embodiment

Figure 1:
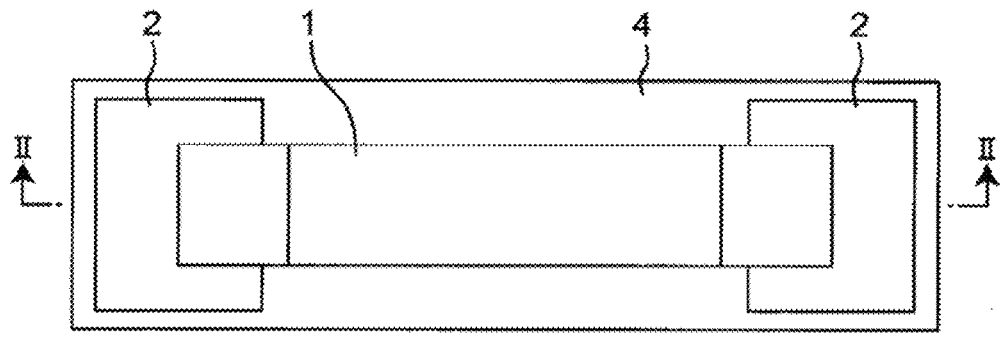
FIG. 1 is a top view of an electromagnetic wave detector according to a first embodiment of the present invention.
Figure 2:
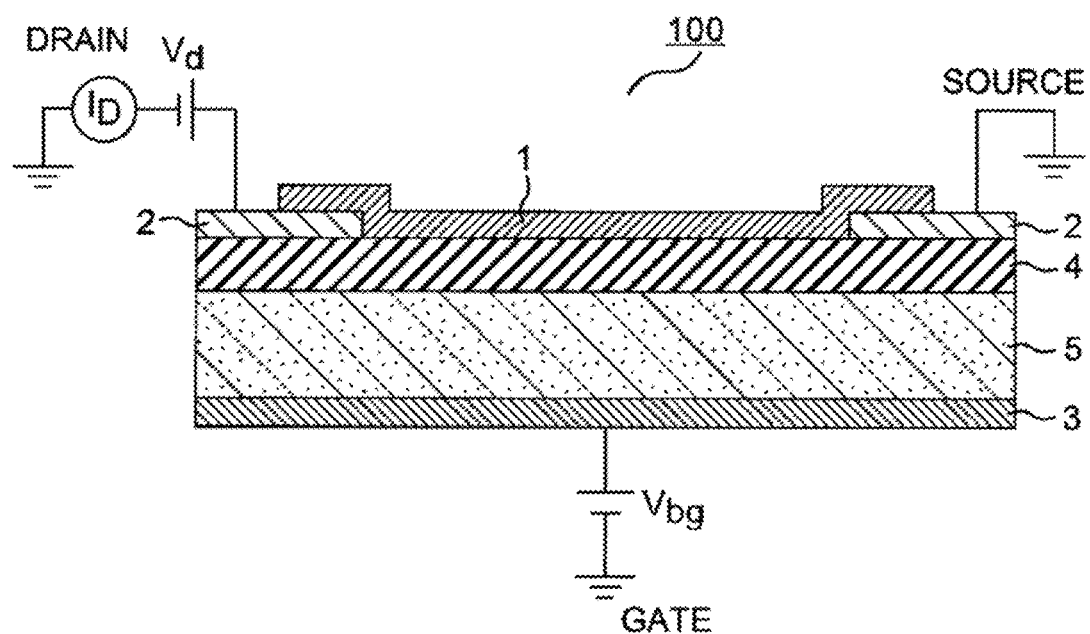
FIG. 2 is a sectional view of the electromagnetic wave detector of FIG. 1, viewed in the II-II direction.

FIG. 1 is a top view of an electromagnetic wave detector according to a first embodiment of the present invention, which is entirely denoted by 100. FIG. 2 is a sectional view of the electromagnetic wave detector 100 of FIG. 1, when viewed in the II-II direction. FIG. 2 also shows a typical electrical connection of the electromagnetic wave detector 100.

The electromagnetic wave detector 100 includes a substrate 5 having a front surface and a back surface. The substrate 5 is, for example, a silicon substrate that is doped with impurities to form a back gate as described later.

Here, the substrate 5 has been described by using a silicon substrate as an example, but it may be a substrate containing: a single material of germanium, a compound semiconductor such as a III-V group or II-V group semiconductor, mercury cadmium tellurium, indium antimony, lead selenium, lead sulfur, cadmium sulfur, gallium nitrogen, silicon carbide, a material including a quantum well or quantum dot, a Type II superlattice, or the like; or a material that combines them.

An insulating layer 4 is provided on the substrate 5. The insulating layer 4 is made of a rare earth oxide in which a rare earth element having a light sensitivity is added or doped (hereinafter, referred to as "activated") in the base material of the rare earth oxide. Details of the rare earth oxide in which a rare earth element having a light sensitivity is activated in the base material of the rare earth oxide will be described later.

The base material is, for example, a yttrium oxide ($Y_2O_3$), a lanthanum oxide ($La_2O_3$), a cerium oxide ($Ce_2O_3$), a gadolinium oxide ($Gd_2O_3$), or a lutetium oxide ($Lu_2O_3$). The rare earth element to be activated in the base material is, for example, one or more elements of praseodymium, neodymium, samarium, europium, terbium, dysprosium, holmium, erbium, thulium, and ytterbium. The insulating layer 4 is formed by being overlapped on a silicon oxide ($SiO_2$) (not shown) formed on the substrate 5 by thermal or natural oxidation. Alternatively, the insulating layer 4 is formed by being overlapped on another insulating layer formed by using, for example, a CVD method or a sputtering method. Here, the insulating layer 4 may be a single layer of an insulating layer made of a rare earth oxide in which a rare earth element having a light sensitivity is activated in the base material of the rare earth oxide.

A pair of electrodes 2 is provided on the insulating layer 4 so as to be arranged to face each other across a gap. The electrode 2 is formed of a metal such as, for example, Au, Ag, Cu, Al, Ni, Cr, or Pd. In order to improve the adhesion between the electrode 2 and the insulating layer 4 therebelow, an adhesion film (not shown) made of Cr or Ti may be formed between the electrode 2 and the insulating layer 4. The adhesion film has the same planar shape as the electrode 2. The shape of the electrode 2 is not particularly limited as long as it has a size and a thickness capable of outputting an electric signal.

A graphene layer 1 is provided on the insulating layer 4 and the electrodes 2 so as to be connected to both the electrodes 2. The graphene layer 1 is made of a single layer or two or more layers of graphene. As the number of the stacked layers of graphene of the graphene layer 1 is increased, a light absorptivity is increased, so that the sensitivity of the electromagnetic wave detector 100 is enhanced. Graphene is a monoatomic layer of two-dimensional carbon crystal, and the thickness of single-layer graphene is as very thin as 0.34 nm that corresponds to one carbon atom. Graphene has a carbon atom in each of chains arranged in a hexagonal shape.

When the graphene layer 1 is formed of a stacked structure of two or more layers of graphene, the directions of the lattice vectors of the hexagonal lattice of the graphene in each layer included in the stacked structure may not be the same, that is, there may be a deviation in the directions. Also, a stacked structure in which the lattice vectors are completely the same may be adopted. In particular, when two or more layers of graphene are stacked, the size of a band gap can be adjusted, whereby a function of selecting the wavelength of an electromagnetic wave to be absorbed can be provided. Unlike the conventional semiconductor detectors, it is not necessary to tune a band gap by the composition of a semiconductor material, and it is sufficient only to adjust the number of the layers of the graphene layer 1. Therefore, the manufacturing steps of the electromagnetic wave detector 100 become easy.

Further, since the size of a band gap can be adjusted by adjusting the number of the layers of the graphene layer 1, it is not necessary to use an optical filter that is a typical wavelength selection means, so that the number of optical components can be reduced. Thereby, a loss of the incident light due to passing through the optical filter can also be reduced.

Furthermore, since graphene has a higher carrier mobility than the conventional semiconductor materials, the electromagnetic wave detector 100 can achieve high-speed operation.

When nanoribbon-shaped graphene is used, the graphene layer 1 may have a structure of a single graphene nanoribbon, a structure in which a plurality of graphene nanoribbons are stacked, or a structure in which graphene nanoribbons are periodically arranged on a plane. When the graphene nanoribbons are arranged periodically, plasmon resonance occurs in the graphene, which has an effect of improving the sensitivity of detecting an electromagnetic wave. The structure in which graphene nanoribbons are arranged periodically may be called a graphene metamaterial, but their phenomena are the same. The graphene layer 1 may be non-doped, but may be P-type or N-type doped.

In FIG. 2, a back electrode 3 formed of, for example, a metal is provided on the back surface of the substrate 5 in order to easily apply a back gate voltage. However, the electromagnetic wave detector 100 operates even without the back electrode 3.

Note that together with the electromagnetic wave detector 100, an output amplifier circuit (not shown) using graphene may be provided on the same substrate as that of the electromagnetic wave detector 100. The output amplifier circuit using graphene operates faster than an output amplifier circuit using a silicon-based semiconductor material, and a high-performance electromagnetic wave detector can be achieved. Further, by using graphene in a peripheral circuit such as a readout circuit, high-speed read out and simplification of a manufacturing process can be achieved.

Next, a specific example of electrical connection of the electromagnetic wave detector 100 will be described. An electric circuit (not shown) for extracting a change in photocurrent such as an external bias is connected to the graphene layer 1 via the electrode 2. One of the electrodes 2 is connected to a power supply and a current detector, and the other of the electrodes 2 is grounded.

When a voltage $V_d$ is applied to the electrode 2 connected to a power supply and a current detector, a current amount $I_d$ flowing between the electrodes 2 changes due to a change in the resistance value of the graphene layer 1 caused when an electromagnetic wave is incident on the graphene layer 1. By detecting the change in the current amount $I_d$, the magnitude of the electromagnetic wave incident on the graphene layer 1 can be detected. Alternatively, a change in an electric amount may be detected, not being limited to a change in the current amount. For example, a change in a voltage value may also be detected by connecting a circuit for passing a constant current between the two electrodes 2. At this time, by using an electromagnetic wave detector (not shown) that has the same structure as the electromagnetic wave detector 100 and is shielded from an electromagnetic wave to be detected, a difference in current or voltage change with the electromagnetic wave detector 100 may be detected. By detecting the difference in this way, an influence of a change in characteristics depending on the environmental temperature can be suppressed, so that highly accurate detection can be achieved.

Figure 3:
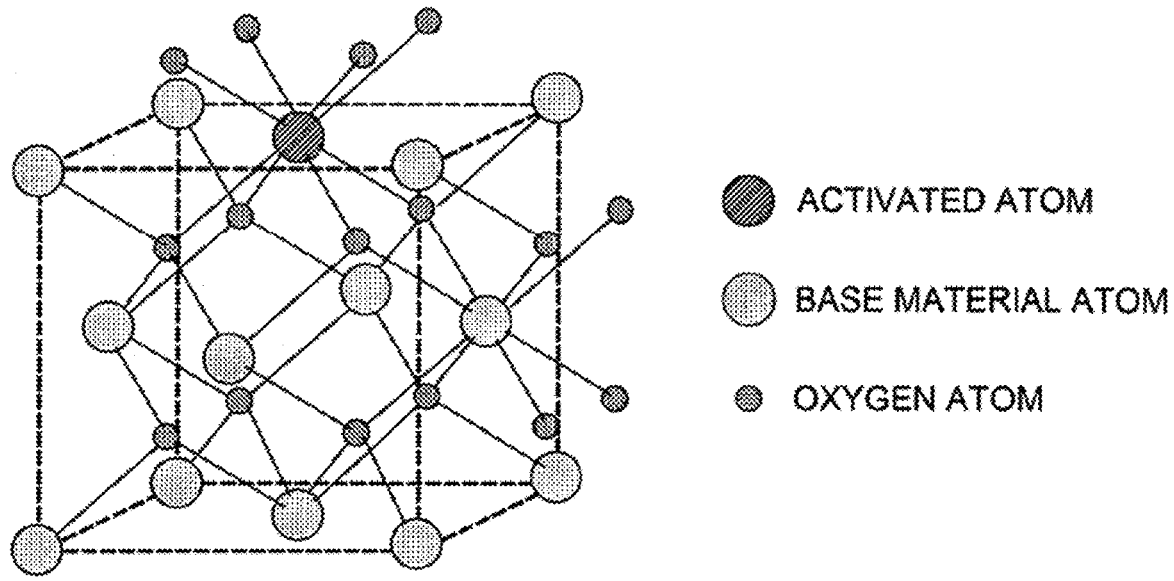
FIG. 3 is a schematic view showing a crystal structure of a rare earth oxide forming an insulating layer of the electromagnetic wave detector according to the first embodiment of the present invention.

FIG. 3 is a schematic view showing a crystal structure of the rare earth oxide forming the insulating layer 4. The rare earth oxide forming the insulating layer 4 is obtained by activating, in the rare earth oxide that is a base material, a rare earth element that generates an ionic inner-shell electron transition described later by the incidence of light. By the activation, some of the rare earth atoms (base material atoms) in the oxide that is a base material are replaced with the activated atoms. The base material atoms are yttrium, lanthanum, cerium, gadolinium, or lutetium. The activated atoms are one or more atoms of praseodymium, neodymium, samarium, europium, terbium, dysprosium, holmium, erbium, thulium, and ytterbium.

The base material atoms are replaced in atomic units with the activated atoms. In the present embodiment, the ionic radii of the base material atom and the activated atom are about the same, and hence a crystal defect or a lattice strain is less likely to occur than the case where another substance having a light sensitivity is embedded in the insulating layer 4. Therefore, the insulating layer 4 hardly causes a crystal defect or a lattice strain and functions as a good insulating layer.

Figure 4:
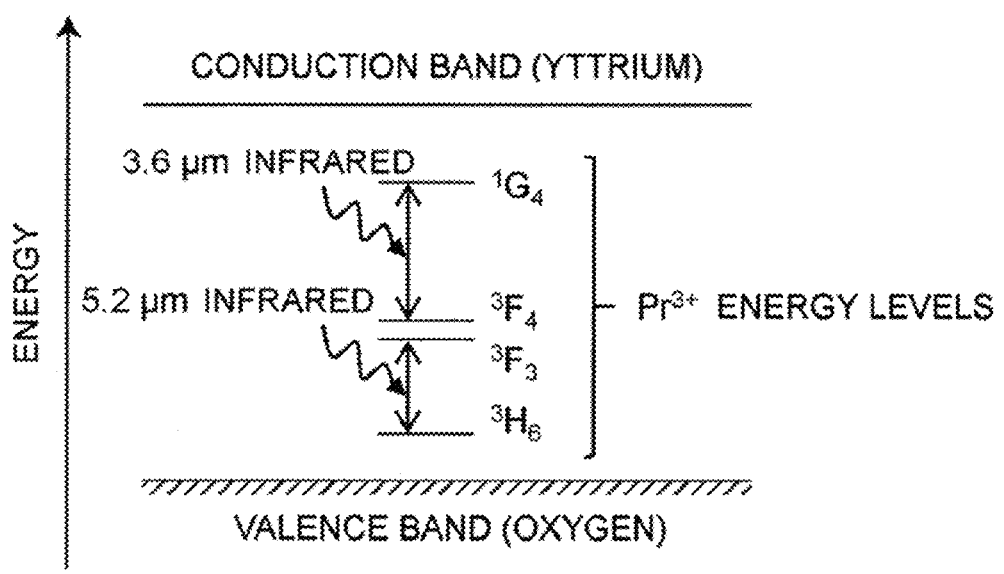
FIG. 4 is a schematic view showing energy levels of electrons of a praseodymium activated yttrium oxide ($Y_2O_3$: Pr).

Next, the operating principle of the electromagnetic wave detector 100 will be described. FIG. 4 is a schematic view showing energy levels of electrons of a praseodymium activated yttrium oxide ($Y_2O_3$: Pr) forming the insulating layer 4. The electron configuration of the 4f core of a praseodymium ion ($Pr^{3+}$) in the praseodymium activated yttrium oxide changes from $^3F_4$ to $^1G_4$ when an infrared ray having a wavelength of 3.6 μm is incident on the praseodymium activated yttrium oxide, and changes from $^3H_6$ to $^3F_3$ when an infrared ray having a wavelength 5.2 μm is incident. In the present description, a change in electron configuration in the 4f electron shell of an activated element ion as described above is referred to as an "ionic inner-shell electron transition". In this way, praseodymium generates an ionic inner-shell electron transition when an infrared ray having a wavelength of 3.6 μm or an infrared ray having a wavelength of 5.2 μm is incident.

As shown in FIG. 4, the ionic inner-shell electron transition is generated between the band gaps of the yttrium oxide that is a base material, and hence an electron does not make a transition between the valence band and the conduction band of the base material and between the base material and the activated element. Therefore, the insulation of the insulating layer 4 (see FIG. 2) is maintained before and after the ionic inner-shell electron transition. In the electromagnetic wave detector 100, an electric field (hereinafter, referred to as an "internal electric field") due to the ionic inner-shell electron transition is generated inside the insulating layer 4 by injecting an electromagnetic wave having a specific wavelength, as described above, while the insulating layer of the insulating layer 4 is being maintained. A voltage is applied to the graphene layer 1 by this internal electric field. This voltage acts as a gate voltage for the graphene layer 1.

The ionic inner-shell electron transition, generated when the material of the insulating layer 4 is a praseodymium activated yttrium oxide, has been described above. But also when the insulating layer 4 is formed of another rare earth oxide, an ionic inner-shell electron transition is similarly generated in the rare earth element ion activated in the insulating layer 4 by injecting an electromagnetic wave having a specific wavelength, so that the internal electric field is generated and a voltage is applied to the graphene layer 1.

As described above, the graphene layer 1 is an ultimate thin-film ideally having a thickness of one atomic layer, and has a high electron mobility. Therefore, a larger current change occurs even when a slight voltage change occurs, as compared to normal semiconductors. As a result, a large current change occurs when an electromagnetic wave is incident, so that the electromagnetic wave can be detected with high sensitivity. Such an effect is called an optical gate effect or an optical switch.

Figure 5:
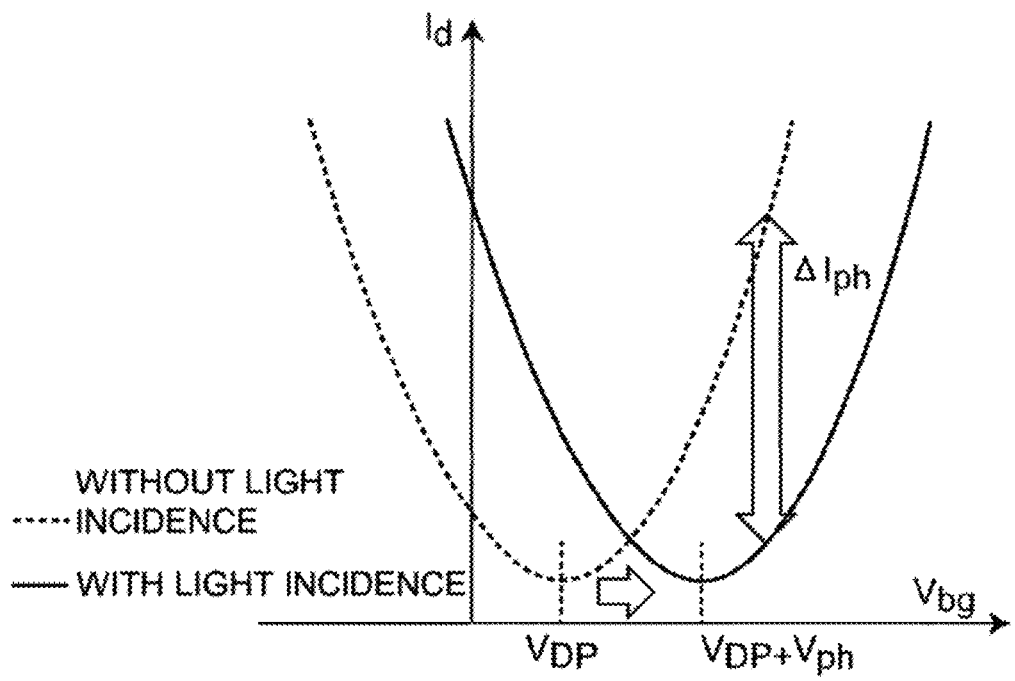
FIG. 5 is a graph for specifically explaining an optical gate effect.

FIG. 5 is a graph for specifically explaining the optical gate effect. In FIG. 5, the vertical axis represents a source-drain current $I_d$ flowing between the electrodes 2, and the horizontal axis represents a back gate voltage $V_{bg}$ applied to the back electrode 3. In FIG. 5, the broken line shows the current $I_d$ when no light is incident (without light incidence), and the solid line shows the current $I_d$ when light is incident (with light incidence).

When the back gate voltage $V_{bg}$ is changed and no light is incident, a bipolar transistor operation in normal graphene is performed. In this case, the back gate voltage $V_{bg}$ that gives a Dirac point where the drain current $I_d$ becomes minimum is set to $V_{DP}$.

On the other hand, when light is incident, an internal electric field is generated inside the insulating layer 4 due to the ionic inner-shell electron transition of the activated rare earth element. In this case, a back gate voltage change $V_{ph}$ due to the internal electric field in the insulating layer 4 is applied to the graphene layer 1 in addition to the back gate voltage $V_{bg}$ applied from the back electrode 3. Therefore, when light is incident, the current-voltage characteristic shown by the solid line in FIG. 5 is obtained, and the Dirac point voltage ($V_{DP}$) is effectively shifted to $V_{DP}+V_{ph}$ as shown by the dotted lines. For a constant back gate voltage $V_{bg}$ value, a difference (differential current) $\Delta I_{ph}$ occurs between the drain current $I_d$ occurring when no light is incident and the drain current $I_d$ occurring when light is incident due to this shift. The electromagnetic wave detector 100 can detect an incident electromagnetic wave by detecting the differential current $\Delta I_{ph}$.

In the current-voltage characteristic shown in FIG. 5, a larger value of the differential current $\Delta I_{ph}$ can be obtained by applying a back gate voltage at which the drain current $I_d$ has a steep slope. Since a large differential current $\Delta I_{ph}$ can be obtained with a small voltage change $V_{ph}$ in this way, highly sensitive detection can be achieved.

Next, a manufacturing method of the electromagnetic wave detector 100 will be briefly described with reference to FIG. 2. The manufacturing method of the electromagnetic wave detector 100 includes the following steps 1 to 4.

[Step 1]

A substrate 5, having a front surface and a back surface that are flat and substantially parallel to each other, is provided. The substrate 5 is made of, for example, silicon. A circuit for driving the detector, a readout circuit, etc., may be formed in advance on the substrate 5.

[Step 2]

An insulating layer 4 is formed on the substrate 5. It is preferable that a rare earth oxide that forms the insulating layer 4 be produced by a production method that enables an element to be activated to be dispersed in a base material in atomic units (not as ions or compounds). A way of dispersing an element to be activated in a base material in atomic units is, for example, any one of the following dispersing means 1 to 5.

Dispersing means 1: A base material element and an aqueous solution of a salt, such as a nitrate or chloride of an element to be activated, are mixed; the atoms to be activated are dispersed in the base material atoms as ions; and then the mixture is oxidized.

Dispersing means 2: By reducing a mixed aqueous solution of a base material element and a salt of an element to be activated, a hydroxide, carbonate, or hydroxycarbonate of a rare earth element is synthesized as a precursor; and then the precursor is heated, whereby a target rare earth oxide may be obtained. By adjusting the particle size and amount of the precursor, a rare earth oxide having a desired thickness can be obtained.

Dispersing means 3: To a mixed aqueous solution of a base material element and a salt of an element to be activated, glutamic acid, a metal alkoxide, or the like is added as a gelling agent; and then the mixture is heated, whereby a target rare earth oxide may be obtained. Since the gelling agent prevents, during the heating, migration of the base material atoms and the atoms to be activated, segregation of the element to be activated is prevented, whereby a rare earth oxide in which the element to be activated is uniformly dispersed in the base material can be obtained.

Dispersing means 4: To a mixed aqueous solution of a base material element and a salt of an element to be activated, a metal such as sodium or potassium having a melting point lower than that of the rare earth element is added; and then the mixture is heated, whereby a target rare earth oxide may be obtained. The metal element is melted by the heating, and the element to be activated is mixed in the base material in the solution containing the metal element, whereby a rare earth oxide in which the element to be activated is uniformly dispersed in the base material can be obtained.

Dispersing means 5: In a pressure vessel, a mixed aqueous solution of a base material element and a salt of an element to be activated is heated together with water and ethanol or glycol; and a rare earth oxide may be obtained by utilizing high pressure in the pressure vessel due to the evaporation of water and ethanol or glycol. While all of the above ways require a high temperature of at least 500° C. to obtain a rare earth oxide having good crystallinity, this way utilizing high pressure can obtain a rare earth oxide having higher crystallinity at a lower temperature of about 100 to 300° C.

Examples of the method of forming the insulating layer 4 on the substrate 5 include, for example:

a method of producing a rare earth oxide directly on the substrate 5 to form a film by generating, on the substrate 5, a chemical reaction of any one of the above ways;

a method of forming a rare earth oxide on the substrate 5 by using a sputtering method in which the rare earth oxide produced by any one of the above ways is used as a target material;

a CVD method;

a method of stacking the rare earth oxide produced by any one of the above ways on a silicon oxide ($SiO_2$) formed by thermal or natural oxidation;

a method of stacking the rare earth oxide produced by any one of the above ways on another insulating layer formed by using a CVD method or a sputtering method;

and the like.

When a CVD method is used, a composition can be easily adjusted by adjusting a raw material or a gas flow rate, so that the element to be activated can be easily adjusted.

[Step 3]

A pair of electrodes 2 is formed on the insulating layer 4 so as to be arranged to face each other across a gap. The electrode 2 is made of, for example, Au, Ag, Cu, Al, Ni, Cr, Ti, Pd, or the like. In order to improve the adhesion between the electrode 2 and the insulating layer 4 therebelow, an adhesion film (not shown) made of Cr and/or Ti may be formed between the electrode 2 and the insulating layer 4.

The electrode 2 and the adhesion film are formed by: forming a uniform film; then forming a pattern with a resist mask by using photoengraving, electron beam drawing, or the like; and then removing unnecessary portions by etching or milling.

Alternatively, the electrode 2 and the adhesion film may be formed by: forming a resist mask having a predetermined portion opened on the insulating layer 4; then depositing a metal layer such as Au by vapor deposition or sputtering; and then removing the resist mask.

The shape of the electrode 2 may be a rectangle in plan view as shown in FIG. 1, but it is not limited thereto. The shape of the electrode 2 may be, for example, a bow-tie antenna shape. Additionally, an antenna effect or plasmon resonance between the electrodes 2 is generated by, for example, bringing the electrodes 2 closer to each other, whereby a detection efficiency only for a specific wavelength can also be increased.

[Step 4]

A graphene layer 1 is formed on the electrodes 2 and the insulating layer 4. The graphene layer 1 is formed by epitaxial growth. Alternatively, graphene formed in advance on another substrate by using a CVD method or graphene peeled by mechanical peeling or the like may be transferred and attached onto the electrodes 2 and the insulating layer 4. Subsequently, the graphene is covered with a resist mask by photoengraving or the like, and patterned by etching in an oxidizing atmosphere such as, for example, oxygen plasma. Thereby, unnecessary graphene, other than those on the electrodes 2 and in the channel portion between the electrodes 2, is selectively removed.

In an example described again with reference to FIGS. 1 and 2, the gap between the two electrodes 2 of the completed electromagnetic wave detector 100 is 50 µm. The length, in the II-II line direction in FIG. 1, of each electrode 2 is 50 µm. The electrode 2 has a metal multi-layer structure whose outermost surface layer is Au. The thickness of the electrode 2 is 30 nm. A Cr film (not shown) having a thickness of 10 nm may be formed between the electrode 2 and the insulating layer 4 in order to improve adhesion. The insulating layer 4 is made of 1 mol % praseodymium activated yttrium oxide ($Y_2O_3$: Pr, 1 mol %) and has a thickness of several tens nm to 300 nm, for example, 290 nm. The substrate 5 is made of P-type doped silicon.

Through the above steps 1 to 4, the electromagnetic wave detector 100 according to the first embodiment of the present invention is completed.

In the electromagnetic wave detector 100 according to the first embodiment of the present invention, an optical gate is generated in the graphene layer 1 formed on the insulating layer 4, by using as the insulating layer 4 a rare earth oxide that generates an ionic inner-shell electron transition by the incidence of light, whereby highly sensitive light detection can be achieved, as described above.

As the technology for generating an optical gate in graphene, it has been proposed to spray quantum dots on the graphene. In the conventional technology using quantum dots, however, there is a problem that charges are trapped by the graphene and a sensitivity is deteriorated. On the other hand, in the electromagnetic wave detector 100 according to the first embodiment of the present invention, direct charge transfer and trapping are not caused between the insulating layer 4 and the graphene layer 1. Therefore, a high-speed response can be achieved without sacrificing sensitivity, as compared to the conventional technology using quantum dots as an optical gate material.

Additionally, in the method of forming quantum dots on graphene, a process of applying a solution or the like containing quantum dots is generally performed, but in this method it is extremely difficult to uniformly array the quantum dots on the graphene, so that a detection sensitivity varies greatly. Even if other methods are used, it is extremely difficult to uniformly array quantum dots on graphene. Therefore, when quantum dots are applied to, for example, an image sensor, variations occur among pixels, which deteriorates performance. On the other hand, when a rare earth oxide layer is used as a gate as in the present invention, it is easy to uniformly disperse an element to be activated in a base material in the manufacturing steps, whereby a film having a uniform sensitivity can be easily formed.

The electromagnetic wave detector 100 according to the first embodiment of the present invention has an advantage that a wavelength to be selected and a sensitivity can be adjusted by changing an element to be activated that is to be used in the insulating layer 4. For example, europium has a sensitivity to an ultraviolet wavelength range and ytterbium has a sensitivity to a near-infrared wavelength range, and hence when the electromagnetic wave detector 100 having a sensitivity to, for example, an ultraviolet wavelength range is intended to be used, europium is activated in the insulating layer 4. Further, the sensitivity of the electromagnetic wave detector 100 can be adjusted by adjusting the amount of an element to be activated that is to be used in the insulating layer 4. Furthermore, the electromagnetic wave detector 100 has a sharp and invariant absorption wavelength spectrum that is not affected by a base material and the surrounding crystal field, by using an ionic inner-shell electron transition.

Still furthermore, in the electromagnetic wave detector 100 according to the first embodiment of the present invention, a combination of wavelength sensitivities can be freely selected by activating, in the insulating film 4, a plurality of rare earth elements having different ion core electron levels. By activating, for example, rare earth elements of europium and ytterbium in the insulating film 4, an electromagnetic wave detector 100 can be obtained, the detector 100 being capable of detecting electromagnetic waves having wavelengths in an ultraviolet wavelength range and a near-infrared wavelength range. By activating a plurality of rare earth elements, a combination of wavelength sensitivities can be freely selected. Therefore, in the electromagnetic wave detector 100, noise is not caused when an electromagnetic wave having a wavelength outside a target wavelength is incident, as compared with the conventional technology in which a semiconductor substrate that is uniformly sensitive to light having a wavelength shorter than the band gap is used as an optical gate material. As described above, the electromagnetic wave detector 100 can detect electromagnetic waves in a wide wavelength range with high sensitivity.

An example in which the insulating layer 4 is a single layer has been described above, but the insulating layer 4 is not limited thereto. The insulating layer 4 may be formed, for example, by stacking a plurality of insulating layers including different rare earth elements to be activated, or by arranging a plurality of the insulating layers side by side in the planar direction.

First Modification

Figure 6:
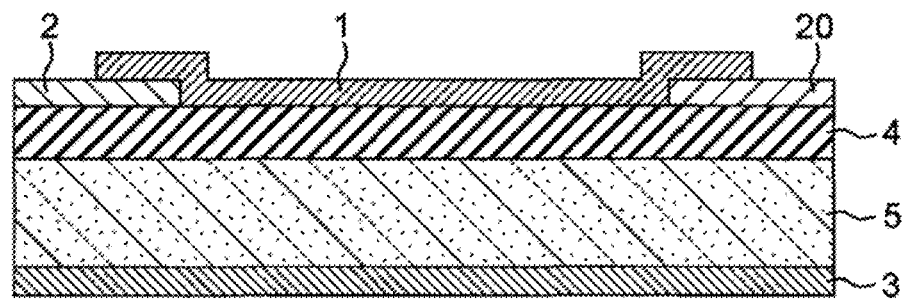
FIG. 6 is a sectional view showing a modification of the electromagnetic wave detector according to the first embodiment of the present invention.

Next, with reference to FIG. 6, a first modification of the electromagnetic wave detector according to the first embodiment of the present invention, which is entirely denoted by 150, will be described. In the first modification, a pair of an electrode 2 and an electrode 20 is provided on an insulating layer 4 of the electromagnetic wave detector 150 so as to be arranged to face each other across a gap. The electrodes 2 and 20 are made of metals different from each other.

For example, the electrode 2 may be made of Ti, and the electrode 20 may be made of Pd. Graphene has different Fermi level and contact resistance depending on the type of a metal that the graphene contacts. Therefore, when the one electrode 2 and the other electrode 20 are made of metals different from each other, the energy gaps of a graphene layer 1 at the source electrode and the drain electrode become different from each other. As a result, when an electromagnetic wave is emitted, a photocurrent between the electrode 2 and the electrode 20 due to the generated carriers increases. Therefore, the sensitivity of the electromagnetic wave detector 150 is improved.

Second Modification

Figure 7:
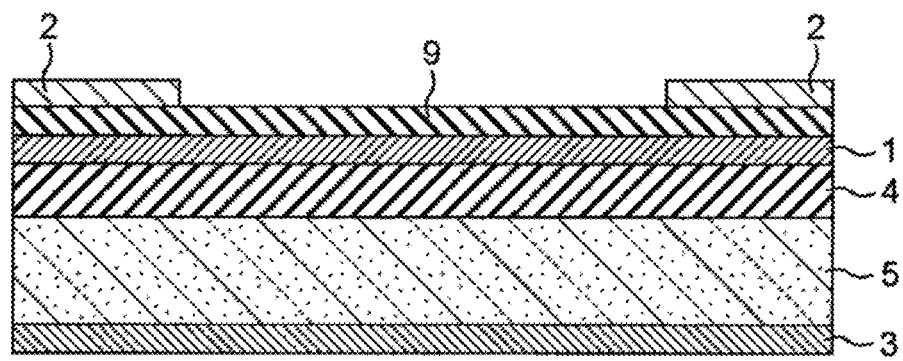
FIG. 7 is a sectional view showing another modification of the electromagnetic wave detector according to the first embodiment of the present invention.

Further, with reference to FIG. 7, a second modification of the electromagnetic wave detector according to the first embodiment of the present invention, which is entirely denoted by 160, will be described. In the second modification, a graphene layer 1 is provided on an insulating layer 4 of the electromagnetic wave detector 160 instead of the electrodes 2. A protective film 9 made of an insulator is provided on the graphene layer 1, and a pair of electrodes 2 is provided on the protective film 9 so as to be arranged to face each other across a gap. The protective film 9 can prevent the graphene layer 1 from being damaged during the formation of the electrodes 2, and can protect the graphene layer 1 from impurities and noise from the outside. Therefore, an electromagnetic wave detector with higher performance can be obtained.

Third Modification

A third modification of the electromagnetic wave detector according to the first embodiment of the present invention will be described. In the third modification, a graphene layer 1 has a turbostratic structure.

Next, a manufacturing method of an electromagnetic wave detector having the graphene layer 1 having a turbostratic structure will be described. In the third modification, steps before the step of forming the graphene layer having a turbostratic structure are the same as the steps 1 to 4 of the first embodiment, and hence description thereof will be omitted.

After the step 4, a graphene layer produced by CVD is transferred multiple times onto the graphene layer exposed on the surface, whereby the graphene layer is made to have a turbostratic structure. Thereafter, the graphene other than in the channel region is removed. Thereby, a graphene channel having a turbostratic structure can be obtained.

Alternatively, the multiple transfer of a graphene layer as described above may be performed before the step 4.

Next, the effect of the third modification will be described. The stacking mode in normal stacked graphene is called an A-B stack, in which graphene is stacked in a state in which lattices are aligned. On the other hand, the graphene produced by CVD is polycrystalline, and when the graphene is further transferred onto the graphene multiple times or when graphene is stacked by CVD in which the underlying graphene is used as nuclei, the structure of the graphene layer becomes a turbostratic structure in which lattices are not aligned. The graphene having the turbostratic structure is less affected by an interaction between layers and has the same properties as single-layer graphene.

Further, in a graphene layer, the carrier mobility is usually decreased due to an influence of carrier scattering in the underlying insulating layer 4. On the other hand, in the graphene layer having the turbostratic structure, the graphene in contact with the insulating layer 4 is affected by the carrier scattering, but the graphene stacked on the graphene so as to have the turbostratic structure is less affected by the carrier scattering. Therefore, the carrier mobility in the graphene layer 1 is improved, so that the performance of the electromagnetic wave detector is improved.

The configuration of the electromagnetic wave detector in the third modification can be applied to other embodiments.

Second Embodiment

Figure 8:
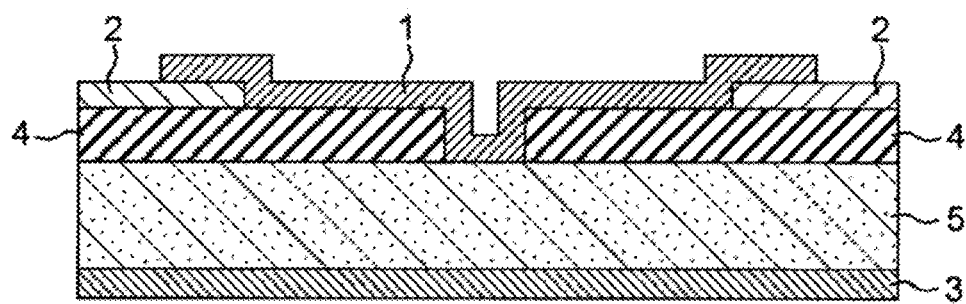
FIG. 8 is a sectional view of an electromagnetic wave detector according to a second embodiment of the present invention.

FIG. 8 is a sectional view of an electromagnetic wave detector according to a second embodiment of the present invention, which is entirely denoted by 170. In the cross section of FIG. 8, an insulating layer 4 does not completely cover a substrate 5. The insulating layer 4 has a through hole formed so as to expose the front surface of the substrate 5. A graphene layer 1 is in contact with the substrate 5 in the through hole. In other words, the graphene layer 1 has a region that contacts the substrate 5 and a region that contacts the insulating layer 4.

Next, a manufacturing method of the electromagnetic wave detector 170 will be described. First, the substrate 5 is provided (step 1A). The insulating layer 4 is then formed on the substrate 5 (step 2A). The steps up to this point are the same as the step 1 and step 2 of the first embodiment.

Next, part of the insulating layer 4 is removed by a removal process such as an etching process (step 3A). Then, a pair of electrodes 2 is formed on the insulating layer 4 so as to be arranged to face each other across a gap (step 4A). The step 4A is the same as the step 3 of the first embodiment. Then, the graphene layer 1 is formed on the electrodes 2, the insulating layer 4, and the substrate 5 (step 5A).

Next, effects of the electromagnetic wave detector 170 according to the second embodiment will be described. In the second embodiment, part of the graphene layer 1 is in contact with the substrate 5. This contact portion has a Schottky structure. Thereby, when a back gate voltage is applied to the substrate 5, the performance of the electromagnetic wave detector 170 can be improved.

When a material that absorbs the detection wavelength of an electromagnetic wave is used in the substrate 5, the carriers generated in the substrate 5 can be directly injected into the graphene layer 1 by the graphene-substrate Schottky. That is, a change in the gate voltage occurs in the graphene layer 1 due to an electric field change generated in the substrate 5 via the insulating layer 4. Thereby, the conductivity of the graphene layer 1 changes due to the electric field change generated in the substrate 5 in addition to the carriers injected from the substrate 5 into the graphene layer 1, so that the detection sensitivity of the electromagnetic wave detector 170 is improved.

The structure having source and drain electrodes has been described above, but the present invention is not limited thereto. For example, the electromagnetic wave detector 170 may have a structure having only either a source or a drain. In this case, the electromagnetic wave detector 170 has a two-terminal diode structure having a source or drain, and a gate. In the electromagnetic wave detector 170 having this structure, an OFF operation can be performed by the Schottky junction.

Further, in the electromagnetic wave detector 170, a dark current is lowered during the OFF operation, so that noise is reduced. Therefore, an electromagnetic wave detector with higher performance can be obtained.

The configuration of the electromagnetic wave detector 170 according to the second embodiment can be applied to other embodiments.

Third Embodiment

Figure 9:
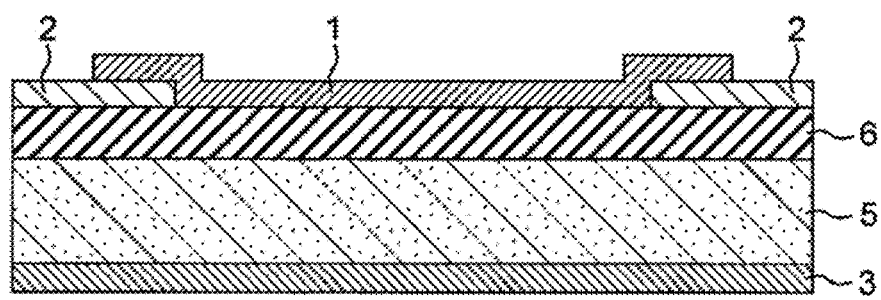
FIG. 9 is a sectional view of an electromagnetic wave detector according to a third embodiment of the present invention.

FIG. 9 is a sectional view of an electromagnetic wave detector according to a third embodiment of the present invention, which is entirely denoted by 200. In the third embodiment, an insulating layer 6 is provided on a substrate 5. The insulating layer 6 of the third embodiment and the insulating layer 4 of the first embodiment (see FIG. 2) differ in the combination of rare earth elements that are materials.

Figure 10:
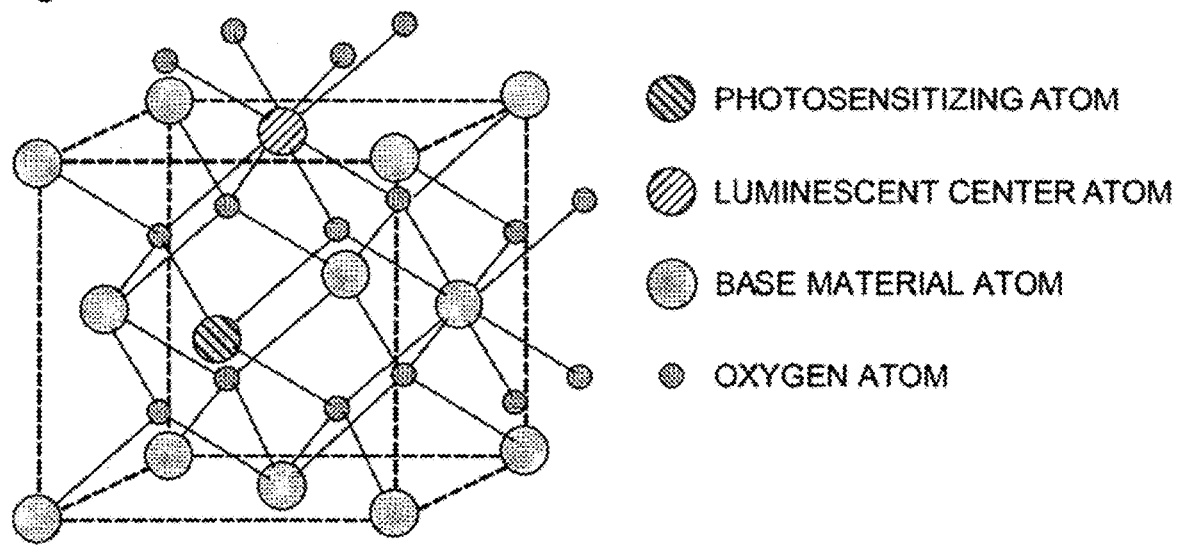
FIG. 10 is a schematic view showing a crystal structure of a rare earth oxide forming an insulating layer of the electromagnetic wave detector according to the third embodiment of the present invention.

FIG. 10 is a schematic view showing a crystal structure of a rare earth oxide forming the insulating layer 6. The insulating layer 6 has a structure in which part of yttrium, lanthanum, gadolinium, or lutetium, which are rare earth atoms (base material atoms) in a base material oxide, are replaced by photosensitizing atoms having a function of absorbing light and luminescent center atoms that act as a luminescent center. The photosensitizing atoms include one or more atoms of cerium, neodymium, and ytterbium. The luminescent center atoms include one or more atoms of praseodymium, samarium, europium, terbium, dysprosium, holmium, erbium, and thulium.

Figure 11:
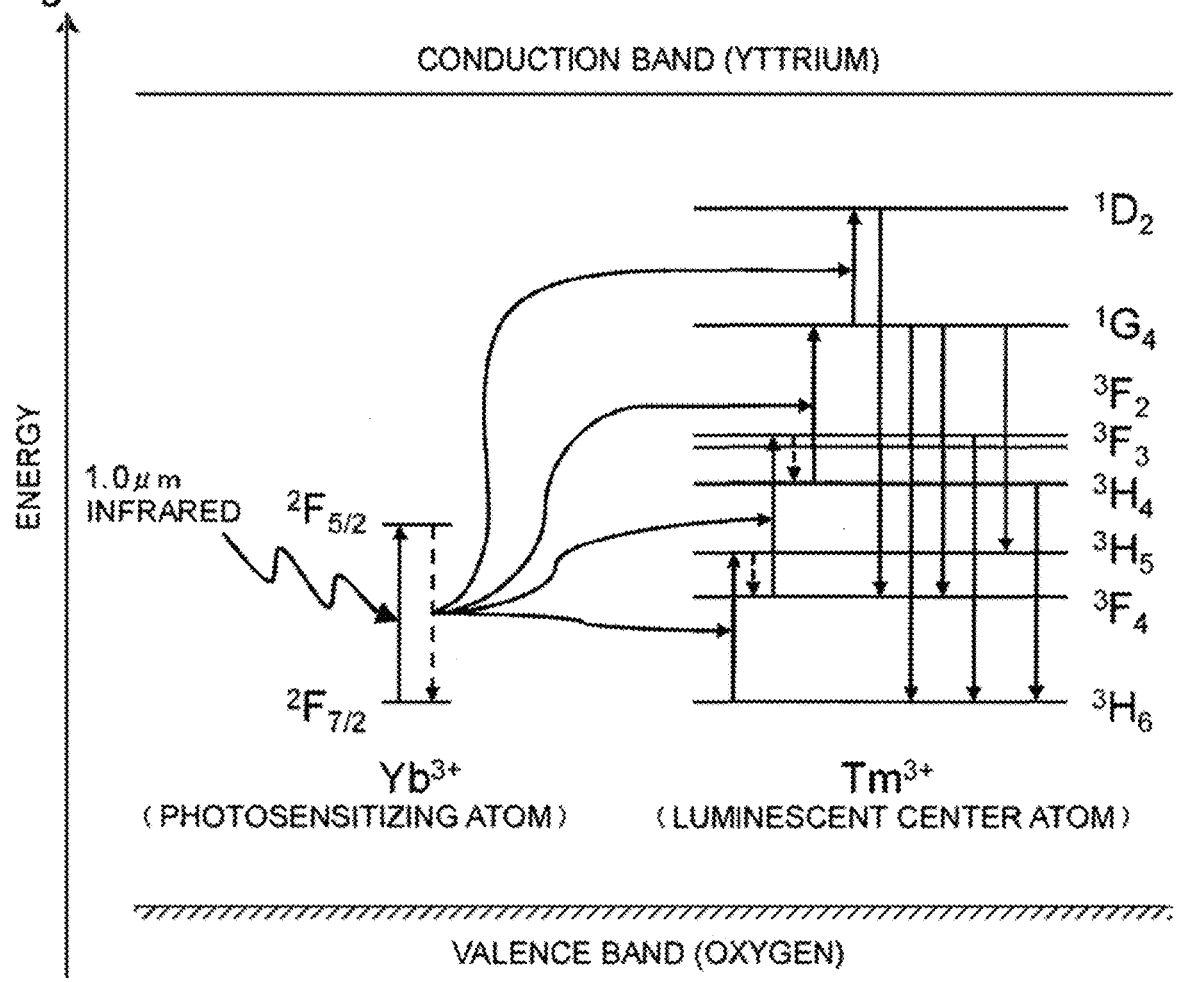
FIG. 11 is a schematic view showing energy levels of electrons of an ytterbium and thulium activated yttrium oxide ($Y_2O_3$: Tm, Yb).

Next, the operating principle of the electromagnetic wave detector 200 will be described. FIG. 11 is a schematic view showing energy levels of electrons of an ytterbium and thulium activated yttrium oxide ($Y_2O_3$: Tm, Yb) forming the insulating layer 6. When an electromagnetic wave having a wavelength of 1.0 μm is incident on the ytterbium and thulium activated yttrium oxide, an ionic inner-shell electron transition ($^2F_{7/2} \rightarrow {}^2F_{5/2}$) is generated with the electrons in the 4f electron shell of an ytterbium ion.

The energy obtained by the electrons of the ytterbium ion by this ionic inner-shell electron transition is used for the ionic inner-shell electron transition of a thulium ion. Here, such energy transfer without luminescence between the activated elements is called Luminescence Resonance Energy Transfer (LRET).

At this time, in the electromagnetic wave detector 200, an internal electric field due to an ionic inner-shell electron transition is generated inside the insulating layer 6 by the ionic inner-shell electron transitions generated in the ytterbium ions and the thulium ions, as described above.

The fluorescence lifetime of the thulium ion is longer and in the order of milliseconds, while the fluorescence lifetime of a common fluorescent substance is in the order of nanoseconds. Note that the fluorescence lifetimes of not only thulium ions but also other rare earth element ions are in the order of milliseconds. Due to the incidence of an electromagnetic wave and the LRET, multi-stage ionic inner-shell electron transitions are generated in the core electron levels of the thulium ion. Thereafter, electromagnetic waves having a higher energy than that of the incident electromagnetic wave (i.e., electromagnetic waves having wavelength of 0.45 to 0.50 μm, 0.64 to 0.68 μm, and 0.78 to 0.84 μm) are emitted from the thulium ion.

Again with reference to FIG. 9, an effect obtained with an electromagnetic wave, having a higher energy than that of the incident electromagnetic wave, emitted from the thulium ion will be described. The electromagnetic wave emitted from the thulium ion is absorbed by the graphene layer 1. Since the electromagnetic wave emitted from the thulium ion has a higher energy than that of the incident electromagnetic wave, the light responsiveness of the graphene layer 1 is improved by the activation of ytterbium and thulium.

Additionally, the electromagnetic wave emitted from the thulium ion is also absorbed by the substrate 5. Therefore, optical carriers (electrons and/or holes generated by light) are generated in the substrate 5, which generates an optical gate effect.

As described above, by activating the photosensitizing atoms and the luminescent center atoms in a base material oxide, three effects can be obtained, the three effects including: an effect of increasing the light responsiveness of the graphene layer 1; an optical gate effect accompanying the generation of optical carriers in the substrate 5; and an optical gate effect due to an internal electric field in the insulating layer 6 generated due to the ionic inner-shell electron transitions between the photosensitizing atoms and the luminescent center atoms. Thereby, an electromagnetic wave can be detected with high sensitivity.

Further, even when an electromagnetic wave having a wavelength that the substrate 5 cannot absorb is incident, the photosensitizing atom and the luminescent center atom can convert the wavelength into a wavelength that the substrate 5 can absorb. For example, when an electromagnetic wave having a wavelength of 1.0 μm is incident in the above example, the wavelengths of the electromagnetic wave emitted from the thulium ion are 0.45 to 0.50 μm, 0.64 to 0.68 μm, and 0.78 to 0.84 μm. Even when the substrate 5 cannot absorb an electromagnetic wave having a wavelength of 1.0 μm but when it can absorb an electromagnetic wave having a wavelength of 0.45 to 0.50 μm, 0.64 to 0.68 μm, or 0.78 to 0.84 μm, the substrate 5 can have a light sensitivity due to the wavelength conversion by the photosensitizing atoms and luminescent center atoms. As described above, the photosensitizing atom and the luminescent center atom have a function of adjusting a wavelength range whose sensitivity is increased by the optical gate effect of the substrate 5.

Although an example in which the material of the insulating layer 6 is an ytterbium and thulium activated yttrium oxide has been described above, the effect of the third embodiment can be similarly exhibited even when the insulating layer 6 is formed of other rare earth oxides. In the above example, ytterbium, which functions as a photosensitizer, has a high sensitivity to the light having a wavelength in the near-infrared range, and hence the light having a wavelength in the near-infrared range can be detected with high sensitivity. On the other hand, cerium is highly sensitive to the light having a wavelength in the ultraviolet range, and neodymium is highly sensitive to the light having a wavelength in the mid-infrared range. Therefore, the wavelength of the light to be detected with high sensitivity can be selected by changing the rare earth element that functions as a photosensitizer.

Fourth Embodiment

Figure 12:
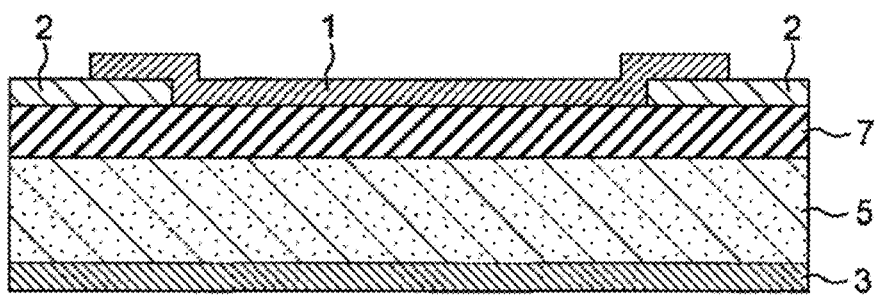
FIG. 12 is a sectional view of an electromagnetic wave detector according to a fourth embodiment of the present invention.

FIG. 12 is a sectional view of an electromagnetic wave detector according to a fourth embodiment of the present invention, which is entirely denoted by 300. In the fourth embodiment, an insulating layer 7 is provided on the substrate 5. The insulating layer 7 of the fourth embodiment is different from the insulating layers 4 of the first and second embodiments (see FIGS. 2 and 8) and the insulating layer 6 of the third embodiment (see FIG. 9) in the combination of rare earth elements that are materials.

Figure 13:
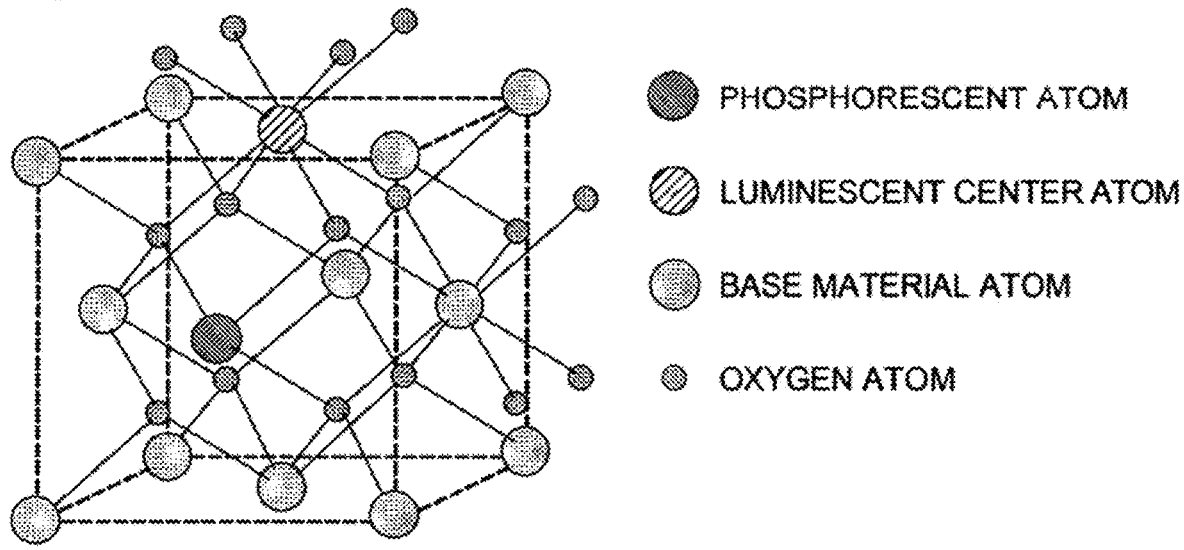
FIG. 13 is a schematic view showing a crystal structure of a rare earth oxide forming an insulating layer of the electromagnetic wave detector according to the fourth embodiment of the present invention.

FIG. 13 is a schematic view showing the crystal structure of a rare earth oxide forming the insulating layer 7. The insulating layer 7 has a structure in which part of yttrium, lanthanum, gadolinium, or lutetium, which are rare earth atoms (base material atoms) in a base material oxide, are replaced with luminescent center atoms that act as a luminescent center and phosphorescent atoms that have a function of storing optical carriers. The luminescent center atom includes one or more atoms of europium, thulium, and ytterbium. The phosphorescent atom includes one or more atoms of cerium, dysprosium, and terbium.

Figure 14:
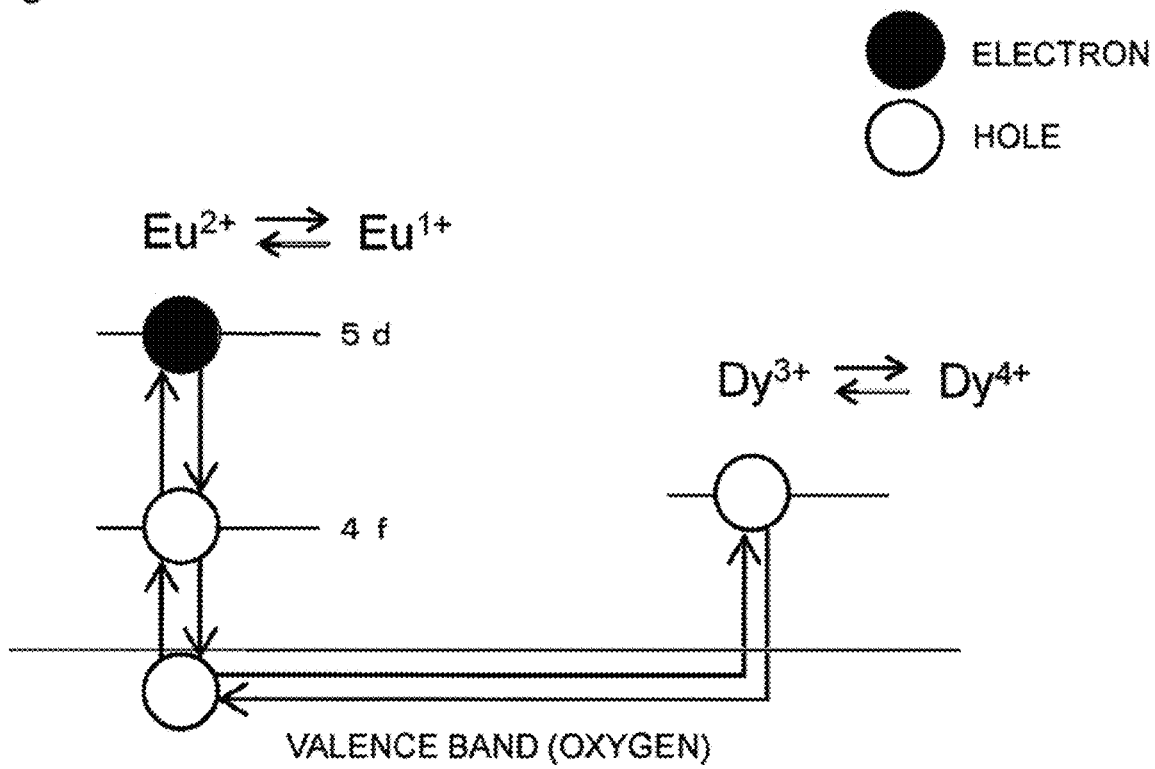
FIG. 14 is a schematic view for explaining a luminescence principle for an europium and dysprosium activated yttrium oxide ($Y_2O_3$: Dy, Eu) when an electromagnetic wave is incident.

Next, the operating principle of the electromagnetic wave detector 300 will be described. FIG. 14 is a schematic view for explaining a luminescence principle for a europium and dysprosium-activated yttrium oxide ($Y_2O_3$: Dy, Eu) forming the insulating layer 7, when an electromagnetic wave is incident. When an electromagnetic wave having a wavelength of, for example, 0.26 μm is incident on the europium and dysprosium-activated yttrium oxide, an ionic inner-shell electron transition of an europium ion and light emission following this transition occur. Further, an electronic transition (excitation) between the 4f level that is the ground state of $Eu^{2+}$ and the 5d level that is an excited state, and light emission following the recombination also occur.

At this time, in the electromagnetic wave detector 300, an internal electric field due to an ionic inner-shell electron transition is generated inside the insulating layer 6 due to the ionic inner-shell electron transition generated in the europium ion and the aforementioned electronic transition (excitation), as described above.

Here, the term "excitation" generally includes any concepts of: (a) generation of an electron-hole pair due to light absorption or the like, that is, the fact that an electron makes a transition from the ground level to a high energy level and a hole is generated in the ground level; and (b) the ionic inner-shell electron transition defined above. In the present description, however, the generation of an electron-hole pair due to light absorption or the like is called "excitation", and the term "excitation" is not used in the case of the ionic inner-shell electron transition, for the purpose of avoiding confusion.

In addition to or simultaneously with the above-described light emission that occurs immediately after the incidence of an electromagnetic wave, a light storage action occurs according to the following principle. A hole is generated in the 4f electron shell of $Eu^{2+}$ by the excitation due to the incidence of an electromagnetic wave. In order to obtain a stable electron configuration by leaving the f orbital empty, a hole in the 4f electron shell of $Eu^{2+}$ is emitted, so that $Eu^{2+}$ becomes $Eu^{1+}$. The emitted hole is released to a valence band thermally composed of oxygen atoms, and is captured by $Dy^{3+}$ of a dysprosium ion functioning as a hole trap via the valence band. Thereby, $Dy^{3+}$ becomes $Dy^{4+}$. That is, an optical carrier in which the europium ion is generated due to the incidence of an electromagnetic wave is stored in the dysprosium ion.

After the emission of an electromagnetic wave is stopped, the holes trapped in $Dy^{4+}$ are gradually thermally released and recombined with $Eu^{1+}$ via the valence band, so that light emission of the europium ion is generated. In this way, the light emission of the europium ion continues even after the emission of an electromagnetic wave is stopped.

The effects obtained by the electromagnetic wave detector 300 will be described again with reference to FIG. 12. The electromagnetic wave emitted from the europium ion is absorbed by the graphene layer 1 and the substrate 5. Therefore, the optical response of the graphene layer 1 is increased, and optical carriers are generated in the substrate 5, so that an optical gate effect is generated.

Three effects can be obtained by the electromagnetic wave detector 300, the three effects including, as described above: the effect of increasing the optical response of the graphene layer 1; the optical gate effect following the generation of optical carriers in the substrate 5; and the optical gate effect due to the internal electric field in the insulating layer 7 following the light emission from the luminescent center atoms. Thereby, an electromagnetic wave can be detected with high sensitivity.

Further, in the electromagnetic wave detector 300, the light emission of the europium ions continues between when an electromagnetic wave is incident and when the incidence of an electromagnetic wave is stopped, and hence detection response continues. By integrating the continuous detection response, the electromagnetic wave detector 300 can detect, with good sensitivity, even faint light that is unable to be detected by the conventional electromagnetic wave detectors.

An example has been described above, in which the material of the insulating layer 7 is a europium and dysprosium activated yttrium oxide, but the effects of the fourth embodiment can be similarly exhibited even when the insulating layer 7 is formed of the above-mentioned other rare earth oxides.

Fifth Embodiment

Figure 15:
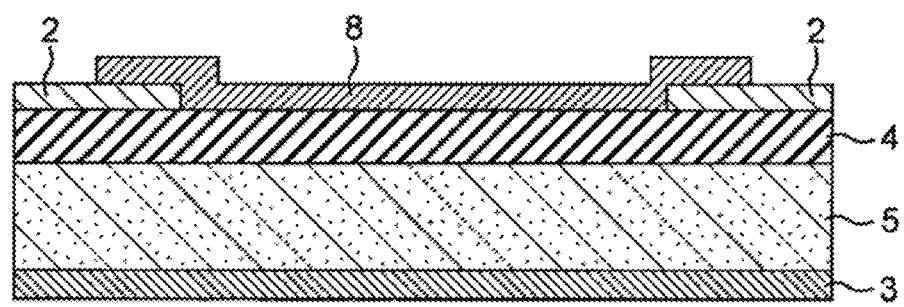
FIG. 15 is a sectional view of an electromagnetic wave detector according to a fifth embodiment of the present invention.

FIG. 15 is a sectional view of an electromagnetic wave detector according to a fifth embodiment of the present invention, which is entirely denoted by 400. In the fifth embodiment, a two-dimensional material layer 8 is provided on an insulating layer 4 and electrodes 2 so as to be connected to both the electrodes 2.

The two-dimensional material layer 8 is made of a two-dimensional material such as transition metal dichalcogenide, black phosphorus, silicene, or germanene. The transition metal dichalcogenide is, for example, $MoS_2$, $WS_2$, $WSe_2$. These two-dimensional materials are ones in which atoms can be arrayed in a single-layer state in a two-dimensional plane, similarly to graphene.

The two-dimensional material layer 8 is made of a single layer or two or more layers of a two-dimensional material. When having a structure of two or more layers, the two-dimensional material layer 8 may be formed by stacking one type of a two-dimensional material or by stacking two or more types of two-dimensional materials. Alternatively, the two-dimensional material layer 8 may be formed by stacking graphene and one or more types of other two-dimensional materials. Alternatively, the two-dimensional material layer 8 may be one in which perovskite and graphene are joined together, or one in which different two-dimensional materials are joined together.

The size of a band gap can be adjusted by adjusting the number of the layers of the two-dimensional material layer 8. By having a band gap, the off current of the two-dimensional material layer 8 can be made almost zero. Further, by adjusting the size of a band gap, a function of selecting the wavelength of the electromagnetic wave to be absorbed can be provided. For example, $MoS_2$ and $WS_2$ have a band gap corresponding to the wavelength of visible light, and black phosphorus has a band gap corresponding to the wavelength of light in the mid-infrared range. Unlike the conventional semiconductor detectors, it is not necessary to tune a band gap by the composition of a semiconductor material, and it is sufficient to adjust the number of the layers of the two-dimensional material layer 8. Therefore, the manufacturing steps of the electromagnetic wave detector 400 are easy.

Furthermore, the size of a band gap can be adjusted by adjusting the number of the layers of the two-dimensional material layer 8, and hence it is not necessary to use an optical filter that is a typical wavelength selection means. Thereby, the number of optical components can be reduced. Thereby, a loss of the incident light due to passing through the optical filter can also be reduced.

Still furthermore, by controlling the stacking direction of the two-dimensional material layer 8, the electromagnetic wave detector 100 that selectively detects only the incident light with a specific polarization can be achieved.

Still furthermore, by forming the two-dimensional material layer 8 with different two-dimensional materials heterojoined together, a quantum well effect and a tunnel effect can be achieved. Thereby, noise can be reduced and the recombination of optical carriers can be reduced, so that detection sensitivity can be improved. In particular, it is a great advantage that the two-dimensional material layer 8 has a tunnel effect of reducing thermal noise in the infrared wavelength range where thermal noise is dominant. Thereby, the electromagnetic wave detector 100 can operate at high temperature, for example, room temperature.

The second to fourth embodiments can also be applied to the fifth embodiment.

Sixth Embodiment

Figure 16:
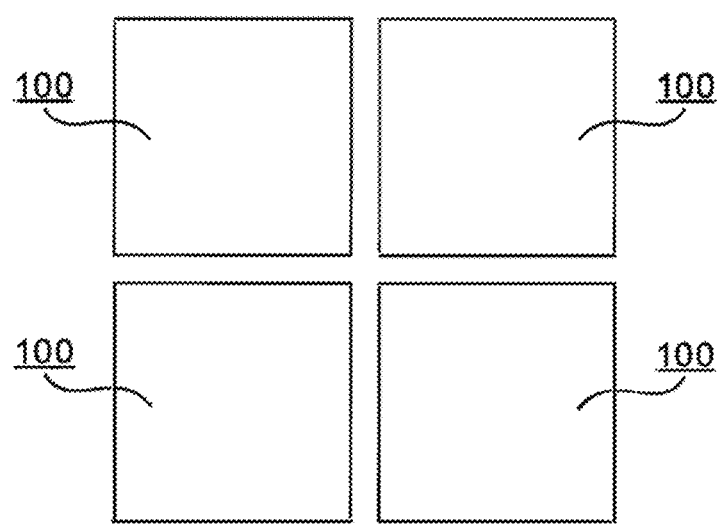
FIG. 16 is a top view of an electromagnetic wave detector array according to a sixth embodiment of the present invention.

FIG. 16 is a top view of an electromagnetic wave detector array according to a sixth embodiment of the present invention, which is entirely denoted by 1000. In the electromagnetic wave detector array 1000 of FIG. 16, the electromagnetic wave detectors 100 according to the first embodiment are arranged in a 2×2 matrix, but the number of the electromagnetic wave detectors 100 to be arranged is not limited thereto. Additionally, in FIG. 16, the electromagnetic wave detectors 100 are arranged two-dimensionally at a predetermined period, but they may be arranged one-dimensionally at a predetermined period. Alternatively, they may be arranged at different intervals instead of periodical manner.

In FIG. 16, the electromagnetic wave detector 100 according to the first embodiment is arranged, but not limited thereto, the electromagnetic wave detector 170 according to the second embodiment, the electromagnetic wave detector 200 according to the third embodiment, the electromagnetic wave detector 300 according to the fourth embodiment, or the electromagnetic wave detector 400 according to the fifth embodiment may be arranged.

In the electromagnetic wave detector array 1000 using the electromagnetic wave detectors 100, an electromagnetic wave in an arbitrary wavelength range, selected from electromagnetic waves in a very wide wavelength range from ultraviolet light to a microwave, can be detected as described above. It can be used as an image sensor particularly by being formed into an array. For example, when the electromagnetic wave detector array 1000 is applied to an in-vehicle sensor, it can be used as a visible light image camera in the daytime and can also be used as an infrared camera at night by switching an optical system. Therefore, it is not necessary to use different cameras depending on a wavelength to be detected.

Figure 17:
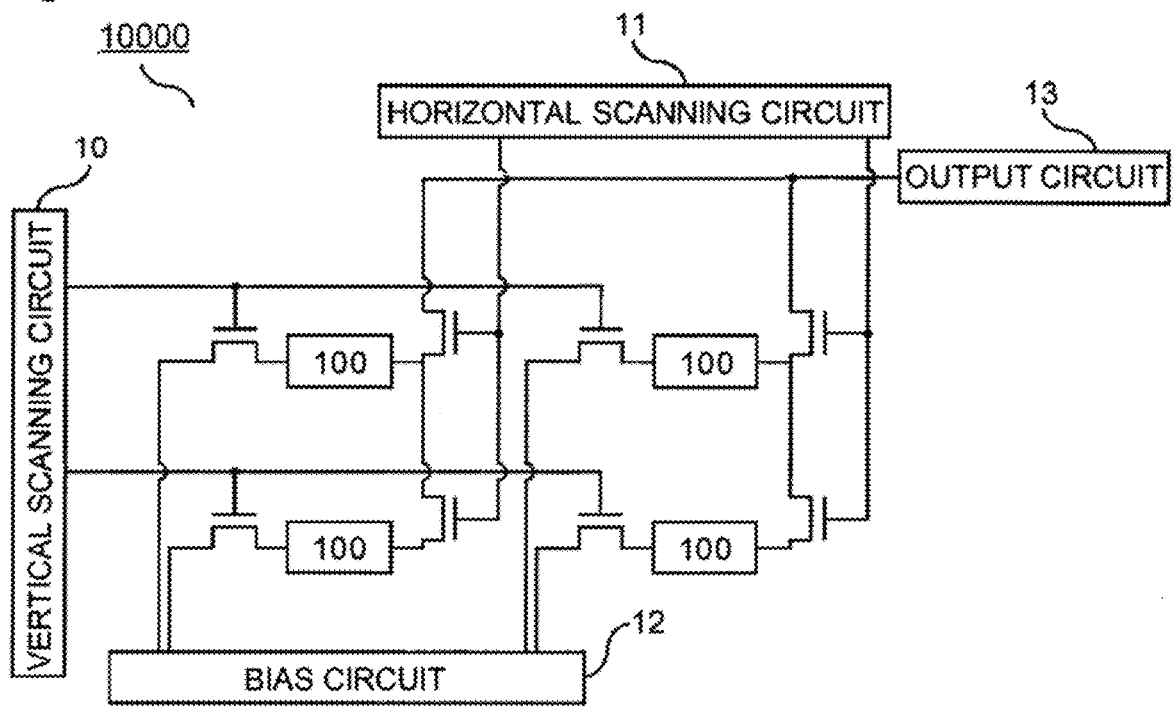
FIG. 17 is a schematic view showing one example of a readout circuit that reads out an electric signal obtained from an electromagnetic wave detector.

It is preferable to install, outside the electromagnetic wave detector array 1000, a detection circuit such as a readout circuit or a matrix selection circuit that reads out an electric signal obtained from each electromagnetic wave detector 100. Alternatively, a detection circuit such as a readout circuit or a matrix selection circuit may be provided on another semiconductor chip and electrically connected to the electromagnetic wave detector array 1000 by a bump or the like. FIG. 17 is a schematic view showing one example of such a detection circuit, which is entirely denoted by 10000. Hereinafter, the electromagnetic wave detector 100 that constitutes the electromagnetic wave detector array 1000 is also referred to as a pixel. The detection circuit 10000 includes a vertical scanning circuit 10 that vertically scans the pixels 100 of the electromagnetic wave detector array 1000, a horizontal scanning circuit 11 that horizontally scans the pixels 100, a bias circuit 12 that supplies a bias voltage to each circuit, and an output circuit 13 that outputs a signal from the horizontal scanning circuit 11 to the outside of the electromagnetic wave detector array 1000.

The detection circuit 10000 detects a response of the electromagnetic wave detector 100 for each pixel. Specifically, one row is selected by applying a voltage to the vertical scanning circuit 10, and one column is selected by applying a voltage to the horizontal scanning circuit 11, whereby a response of one pixel is read out. By fixing the row selected by the vertical scanning circuit 10 and sequentially applying a voltage to the horizontal scanning circuit 11, all pixel responses of the row are read out. Thereafter, similarly, by applying a voltage to the vertical scanning circuit 10 to select another row and sequentially applying a voltage to the horizontal scanning circuit 11, the responses of all the pixels of the another row are read out. By repeating this, the responses of all the pixels can be read out.

In the present embodiment, the method of reading out the response of each pixel by using the vertical scanning circuit 10 and the horizontal scanning circuit 11 has been described, but the present invention is not limited thereto, and responses may be read out for each row or each column, or other methods may be used.

Seventh Embodiment

Figure 18:
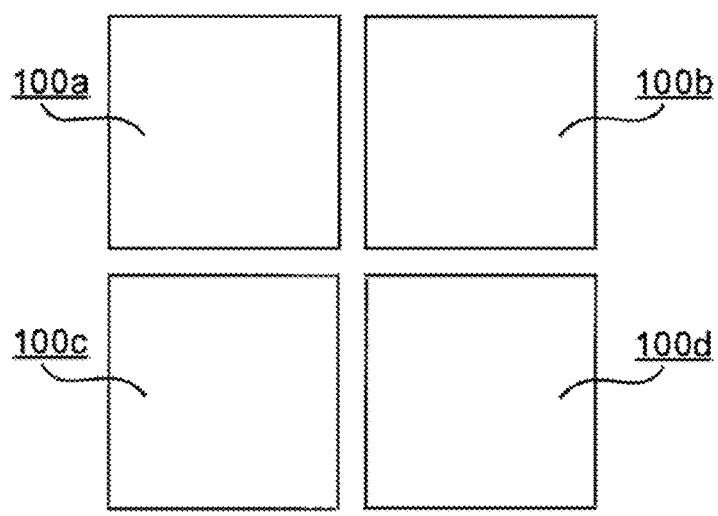
FIG. 18 is a top view of an electromagnetic wave detector array according to a seventh embodiment of the present invention.

FIG. 18 is a top view of an electromagnetic wave detector array according to a seventh embodiment of the present invention, which is entirely denoted by 2000. In FIG. 18, electromagnetic wave detectors 100*a*, 100*b*, 100*c*, 100*d* of types different from each other are arranged in a 2×2 matrix. The number of the electromagnetic wave detectors to be arranged is not limited thereto. In FIG. 18, the electromagnetic wave detectors 100*a*, 100*b*, 100*c*, 100*d* are arranged two-dimensionally at a predetermined period, but may be arranged one-dimensionally at a predetermined period. Alternatively, they may be arranged at different intervals instead of periodical manner.

Each of the electromagnetic wave detectors 100*a*, 100*b*, 100*c*, 100*d* may be any one of the electromagnetic wave detector 100 according to the first embodiment, the electromagnetic wave detector 170 according to the second embodiment, the electromagnetic wave detector 200 according to the third embodiment, the electromagnetic wave detector 300 according to the fourth embodiment, or the electromagnetic wave detector 400 according to the fifth embodiment. By arranging the electromagnetic wave detectors having the detection wavelength selectivity described in the first to fourth embodiments into an array shape, the electromagnetic wave detector array 2000 can detect electromagnetic waves having wavelengths in at least two different bands.

Thereby, the electromagnetic wave detector array 2000 can obtain a colored image (in which wavelengths are identified) also in the wavelength ranges of ultraviolet light, infrared light, a terahertz wave, and a radio wave, similarly to the image sensor to be used in the visible light range.

Further, the electromagnetic wave detector array 2000 can be used as a sensor for detecting the position of an object, even with a small number of pixels. An image sensor that detects the intensities of electromagnetic waves of a plurality of wavelengths can be obtained by the structure of the electromagnetic wave detector array 2000. Thereby, a color image can be obtained by detecting electromagnetic waves of a plurality of wavelengths without using a color filter that has been conventionally required in CMOS sensors, etc.

Further, a polarization identification image sensor can also be formed by forming an array of electromagnetic wave detectors each detecting different polarization. Polarization imaging can be performed by setting, for example, the polarization angles to be detected to 0°, 90°, 45°, and 135° and by arranging a plurality of units of pixels, the one unit including four pixels. With an image sensor that can identify polarization, for example, identification between artificial objects and natural objects, identification of a material, identification between objects of the same temperature in the infrared wavelength range, identification of a boundary between objects, improvement in equivalent resolution, etc., can be made.

Here, the configurations of the electromagnetic wave detectors according to the first to fifth embodiments can be applied to other embodiments. For example, by combining a plurality of the embodiments, the respective insulating layers can also be stacked or arranged side by side in the plane direction.

DESCRIPTION OF REFERENCE SYMBOLS

1 GRAPHENE LAYER
2, 20 ELECTRODE
3 BACK ELECTRODE
4 INSULATING LAYER
5 SUBSTRATE
6, 7 INSULATING LAYER
8 TWO-DIMENSIONAL MATERIAL LAYER
9 PROTECTIVE LAYER
10 VERTICAL SCANNING LAYER
11 HORIZONTAL SCANNING LAYER
12 BIAS CIRCUIT
13 OUTPUT CIRCUIT
100 ELECTROMAGNETIC WAVE DETECTOR
1000 ELECTROMAGNETIC WAVE DETECTOR ARRAY
10000 DETECTION CIRCUIT

The invention claimed is:

1. An electromagnetic wave detector comprising:
an insulating layer formed of a rare earth oxide;
a pair of electrodes provided on the insulating layer so as to be arranged to face each other across a gap; and
a two-dimensional material layer provided on the insulating layer so as to be electrically connected to the pair of electrodes, wherein
the rare earth oxide contains a base material made of an oxide of a first rare earth element, and a second rare earth element different from the first rare earth element, which is activated in the base material.

2. The electromagnetic wave detector according to claim 1, wherein the insulating layer generates an electric field due to an ionic inner-shell electron transition of the second rare earth element activated in the base material by incidence of an electromagnetic wave, and the two-dimensional material layer generates a change in an amount of electricity due to the electric field.

3. The electromagnetic wave detector according to claim 1, wherein:
the rare earth oxide further contains a third rare earth element that is activated in the base material and that functions as a luminescent center; and
the second rare earth element functions as a photosensitizing atom.

4. The electromagnetic wave detector according to claim 3, wherein the third rare earth element emits light by experiencing:
an ionic inner-shell electron transition from a ground level to a first energy level higher than the ground level, caused by receiving electron energy from the second rare earth element; and
an ionic inner-shell electron transition from the first energy level to a second energy level lower than the first energy level, caused by releasing energy.

5. The electromagnetic wave detector according to claim 4, wherein a difference between the first energy level and the ground level is smaller than a difference between the first energy level and the second energy level.

6. The electromagnetic wave detector according to claim 1, wherein:
the rare earth oxide further contains a fourth rare earth element that is activated in the base material and that has a light storage action; and
the second rare earth element functions as a luminescent center.

7. The electromagnetic wave detector according to claim 1, wherein:
the first rare earth element is made of one or more elements selected from the group consisting of yttrium, lanthanum, cerium, gadolinium, and lutetium; and
the second rare earth element is made of one or more elements selected from the group consisting of praseodymium, neodymium, samarium, europium, terbium, dysprosium, holmium, erbium, thulium, and ytterbium.

8. The electromagnetic wave detector according to claim 3, wherein:
the first rare earth element is made of one or more elements selected from the group consisting of yttrium, lanthanum, gadolinium, and lutetium;
the second rare earth element is made of one or more elements selected from the group consisting of cerium, neodymium, and ytterbium; and
the third rare earth element is made of one or more elements selected from the group consisting of praseodymium, samarium, europium, terbium, dysprosium, holmium, erbium, and thulium.

9. The electromagnetic wave detector according to claim 6, wherein:
the first rare earth element is made of one or more elements selected from the group consisting of yttrium, lanthanum, gadolinium, and lutetium;
the second rare earth element is made of one or more elements selected from the group consisting of europium, thulium, and ytterbium; and
the fourth rare earth element is made of one or more elements selected from the group consisting of cerium, dysprosium, and terbium.

10. The electromagnetic wave detector according to claim 1, further comprising a protective film made of an insulator, which is provided on the two-dimensional material layer.

11. The electromagnetic wave detector according to claim 1, wherein each of the electrodes is made of a metal different from a metal of the other electrode.

12. The electromagnetic wave detector according to claim 1, wherein the two-dimensional material layer is made of a two-dimensional material selected from the group consisting of graphene, transition metal dichalcogenide, graphene, black phosphorus, silicene, and germanene, and has a single-layer or multi-layer structure.

13. The electromagnetic wave detector according to claim 1, wherein the two-dimensional material layer has a turbostratic structure.

14. An electromagnetic wave detector array, wherein a plurality of the electromagnetic wave detectors according to claim 1 are arranged in an array shape in a one-dimensional direction or two-dimensional directions.

15. The electromagnetic wave detector according to claim 1, further comprising a substrate, wherein:
   the insulating layer is in contact with the substrate.

16. The electromagnetic wave detector according to claim 15, wherein:
   the insulating layer is provided on the front surface of the substrate.

17. The electromagnetic wave detector according to claim 16, wherein:
   the insulating layer has a through hole formed to expose the front surface of the substrate; and
   the two-dimensional material layer is in contact with the substrate in the through hole.

\* \* \* \* \*